(12) United States Patent
Huang et al.

(10) Patent No.: US 11,418,206 B2
(45) Date of Patent: Aug. 16, 2022

(54) FLASH ANALOG TO DIGITAL CONVERTER AND CALIBRATION METHOD

(71) Applicant: REALTEK SEMICONDUCTOR CORPORATION, Hsinchu (TW)

(72) Inventors: Shih-Hsiung Huang, Hsinchu (TW); Ying-Cheng Wu, Hsinchu (TW); Chien-Ming Wu, Hsinchu (TW); Kai-Yin Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/333,063

(22) Filed: May 28, 2021

(65) Prior Publication Data
US 2022/0069831 A1  Mar. 3, 2022

(30) Foreign Application Priority Data
Sep. 1, 2020 (TW) .................................. 109129851

(51) Int. Cl.
*H03M 1/10* (2006.01)
*H03M 1/36* (2006.01)
*H03M 1/46* (2006.01)

(52) U.S. Cl.
CPC ........... *H03M 1/1023* (2013.01); *H03M 1/10* (2013.01); *H03M 1/362* (2013.01); *H03M 1/46* (2013.01)

(58) Field of Classification Search
CPC ...... H03M 1/1023; H03M 1/362; H03M 1/10; H03M 1/46; H03F 3/00
See application file for complete search history.

(56) References Cited

U.S. PATENT DOCUMENTS

| | | | | |
|---|---|---|---|---|
| 6,603,416 B2 * | 8/2003 | Masenas | ............. | H03M 1/1033 341/120 |
| 8,223,047 B2 * | 7/2012 | Lai | ........................ | H03M 1/365 341/120 |
| 8,350,737 B2 * | 1/2013 | Sanduleanu | ........ | H03M 1/1061 341/120 |

(Continued)

OTHER PUBLICATIONS

Y. Lin, C. Lin and S. Chang, "A 5-bit 3.2-GS/s Flash ADC With a Digital Offset Calibration Scheme," in IEEE Transactions on Very Large Scale Integration (VLSI) Systems, vol. 18, No. 3, pp. 509-513, Mar. 2010, doi: 10.1109/TVLSI.2009.2013628.

(Continued)

*Primary Examiner* — Khai M Nguyen
(74) *Attorney, Agent, or Firm* — WPAT, PC

(57) ABSTRACT

A flash analog to digital converter includes double differential comparator circuits and a calibration circuit. Each double differential comparator circuit compares a first input signal with a corresponding voltage in a first set of reference voltages, and compares a second input signal with a corresponding voltage in a second set of reference voltages, in order to generate a corresponding signal in first signals. The calibration circuit outputs a first test signal to be the first input signal and outputs a second test signal to be the second input signal in a test mode, and calibrates a common mode level of each of the first input signal and the second input signal, or calibrates at least one first reference voltage in the first set of reference voltages and at least one second reference voltage in the second set of reference voltages according to a distribution of the first signals.

17 Claims, 6 Drawing Sheets

(56) References Cited

U.S. PATENT DOCUMENTS

| | | | |
|---|---|---|---|
| 8,674,861 B2* | 3/2014 | Matsuno | H03M 1/12 341/120 |
| 8,928,508 B2* | 1/2015 | Lai | H03M 1/1009 341/120 |
| 9,344,106 B2* | 5/2016 | Lai | H03M 1/365 |
| 2003/0063020 A1 | 4/2003 | Masenas et al. | |

OTHER PUBLICATIONS

OA letter of the counterpart TW application (appl. No. 109129851) dated Apr. 28, 2021. Summary of the OA letter: 1.Claims 1, 2, 5-8, and 10 are rejected as allegedly being unpatentable over first cited reference (US 2003/0063020 A1). 2.Claims 3, 4, and 9 are allowable.

* cited by examiner

400

| Output first test signal to be first input signal, and output second test signal to be the second input signal, in which flash analog to digital converter includes double differential comparator circuits, each of double differential comparator circuits compares first input signal with a corresponding voltage in first set of reference voltages, and compares second input signal with a corresponding voltage in second set of reference voltages, in order to generate a corresponding one of first signals | ~S410 |

↓

| According to distribution of first signals, calibrate common mode level of each of first input signal and second input signal, or at least one first reference voltage in first set of reference voltages and at least one second reference voltage in second set of reference voltages | ~S420 |

Fig. 4

FLASH ANALOG TO DIGITAL CONVERTER AND CALIBRATION METHOD

BACKGROUND

1. Technical Field

The present disclosure relates to a flash analog to digital converter. More particularly, the present disclosure relates to a flash analog to digital converter and a calibration method that observes digital codes to calibrate a systematic offset thereof.

2. Description of Related Art

In current approaches, all comparator circuits in a flash analog to digital converter have the same circuit architecture. If a systematic offset exists, these comparator circuits may not able to operate in a predetermined operation region properly, which results in operation failure of the flash analog to digital converter.

SUMMARY

In some aspects, a flash analog to digital converter includes a plurality of double differential comparator circuits and a calibration circuit. Each of the plurality of double differential comparator circuits is configured to compare a first input signal with a corresponding voltage in a first set of reference voltages, and compare a second input signal with a corresponding voltage in a second set of reference voltages, in order to generate a corresponding signal in a plurality of first signals. The calibration circuit is configured to output a first test signal to be the first input signal and output a second test signal to be the second input signal in a test mode, and calibrate a common mode level of each of the first input signal and the second input signal, or calibrate at least one first reference voltage in the first set of reference voltages and at least one second reference voltage in the second set of reference voltages according to a distribution of the plurality of first signals.

In some aspects, a calibration method for calibrating a flash analog to digital converter includes the following operations: outputting a first test signal to be a first input signal and outputting a second test signal to be a second input signal, in which the flash analog to digital converter includes a plurality of double differential comparator circuits, each of the plurality of double differential comparator circuits is configured to compare a first input signal with a corresponding voltage in a first set of reference voltages, and compare a second input signal with a corresponding voltage in a second set of reference voltages, in order to generate a corresponding signal in a plurality of first signals; and according to a distribution of the plurality of first signals, calibrating a common mode level of each of the first input signal and the second input signal, or calibrating at least one first reference voltage in the first set of reference voltages and at least one second reference voltage in the second set of reference voltages.

These and other objectives of the present disclosure will no doubt become obvious to those of ordinary skill in the art after reading the following detailed description that are illustrated in the various figures and drawings.

BRIEF DESCRIPTION OF THE DRAWINGS

FIG. 4 is a flow chart of a calibration method according to some embodiments of the present disclosure.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
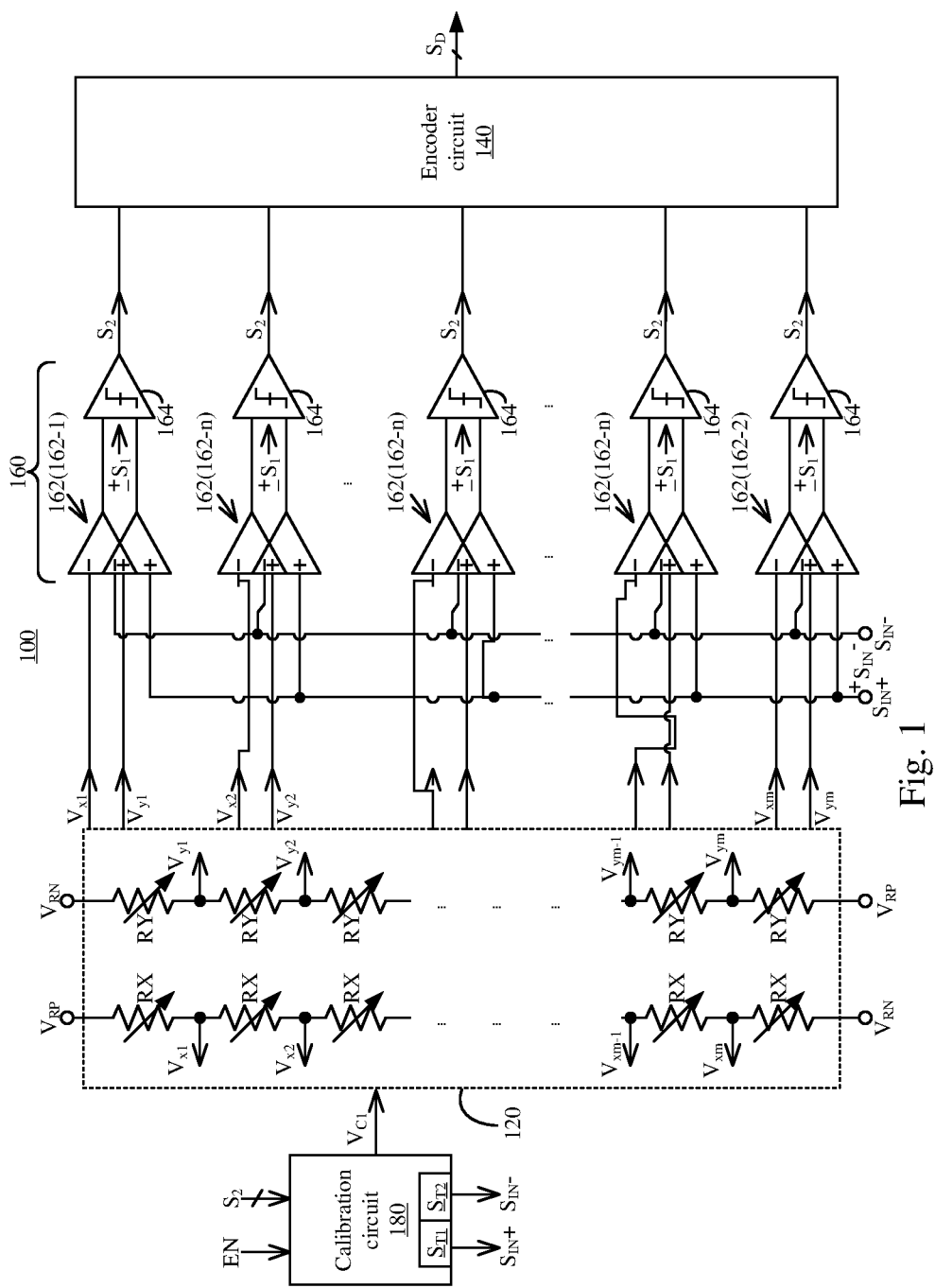
FIG. 1 is a schematic diagram of a flash analog to digital converter according to some embodiments of the present disclosure.

FIG. 1 is a schematic diagram of a flash analog to digital converter 100 according to some embodiments of the present disclosure. The flash analog to digital converter 100 may convert an input signal $S_{IN}$ to be a corresponding digital signal $S_D$, in which the input signal $S_{IN}$ is a difference between an input signal $S_{IN}+$ and an input signal $S_{IN}-$.

The flash analog to digital converter 100 includes a reference voltage generator circuit 120, an encoder circuit 140, a comparator circuitry 160, and a calibration circuit 180. The reference voltage generator circuit 120 generates a first set of reference voltages $V_{x1}$-$V_{xm}$ and a second set of reference voltages $V_{y1}$-$V_{ym}$ according to a voltage VRP and a voltage VRN. For example, the reference voltage generator circuit 120 includes resistors RX and resistors RY. The resistors RX operate as a voltage divider circuit, in order to generate the first set of reference voltages $V_{x1}$-$V_{xm}$ according to the voltage VRP and the voltage VRN. The reference voltage $V_{x1}$ is a voltage closet to the voltage VRP in the first set of reference voltages $V_{x1}$-$V_{xm}$, and the reference voltage $V_{xm}$ is a voltage closet to the voltage VRN in the first set of reference voltages $V_{x1}$-$V_{xm}$.

Similarly, the resistors RY operate as a voltage divider circuit, in order to generate the second set of reference voltages $V_{y1}$-$V_{ym}$ according to the voltage VRN and the voltage VRP. The reference voltage $V_{y1}$ is a voltage closet to the voltage VRN in the second set of reference voltages $V_{y1}$-$V_{ym}$, and the reference voltage $V_{ym}$ is a voltage closet to the voltage VRP in the second set of reference voltages $V_{y1}$-$V_{ym}$.

The implementations of the reference voltage generator circuit 120 are given for illustrative purposes, and the present disclosure is not limited thereto. Various kinds of the reference voltage generator circuit 120 are within the contemplated scope of the present disclosure.

The encoder circuit 140 generates the digital signal $S_D$ according to signals $S_2$. For example, the encoder circuit 140 may encode the signals $S_2$, in order to generate the digital signal $S_D$. In some embodiments, the signals $S_2$ are thermometer codes, and the digital signal $S_D$ is a binary code. In some embodiments, the encoder circuit 140 may be implemented with one or more logic circuits.

The comparator circuitry 160 compares the input signal $S_{IN}$ with each of the first set of reference voltages $V_{x1}$-$V_{xm}$ and the second set of reference voltages $V_{y1}$-$V_{ym}$, in order to generate the signals $S_2$. In this embodiment, the comparator circuitry 160 includes double differential comparator circuits, in which each of the double differential comparator circuits includes a double differential amplifier circuit 162 and a latch circuit 164.

Each of the double differential amplifier circuits 162 compares the input signal $S_{IN}$+ with a corresponding one voltage in the first set of reference voltages $V_{x1}$-$V_{xm}$, and compares the input signal $S_{IN}$− with a corresponding voltage in the second set of reference voltages $V_{y1}$-$V_{ym}$, in order to generate a corresponding one of a signals $S_1$. The signal $S_1$ may be a voltage difference between two output terminals of the double differential amplifier circuit 162. Taking a first double differential amplifier circuit 162 (labeled as 162-1) as an example, the double differential amplifier circuit 162-1 compares the input signal $S_{IN}$+ with the reference voltage $V_{x1}$, and compares the input signal $S_{IN}$− with reference voltage $V_{y1}$, in order to generate a first one of the signals $S_1$. With this analogy, a last double differential amplifier circuit 162 (labeled as 162-2) compares the input signal $S_{IN}$+ with the reference voltage $V_{xm}$, and compares the input signal $S_{IN}$− with the reference voltage $V_{ym}$, in order to generate a last one of the signals $S_1$.

The latch circuits 164 generate the signals $S_2$ according to the signals $S_1$. In some embodiments, the latch circuit 164 may be a circuit having a positive feedback, which pulls a corresponding signal $S_1$ to a rail-to-rail level, in order to generate a corresponding signal $S_2$.

The calibration circuit 180 is configured to ren tests on the comparator circuitry 160, in order to calibrate to systematic offset of at least one comparator circuit. The calibration circuit 180 operates in a test mode in response to an enable signal EN. Under the test mode, the calibration circuit 180 outputs a test signal $S_{T1}$ to be the input signal $S_{IN}$+, and outputs a test signal $S_{T2}$ to be the input signal $S_{IN}$−. In response to the test signal $S_{T1}$ and the test signal $S_{T2}$, the double differential comparator circuits generate the signals $S_2$. According to a distribution of the signals $S_2$, the calibration circuit 180 may calibrate a common mode level of each of the input signal $S_{IN}$+ and the input signal $S_{IN}$−, or calibrate at least one first reference voltage in the first set of reference voltages $V_{x1}$-$V_{xm}$ and at least one second reference voltage in the second set of reference voltages $V_{y1}$-$V_{ym}$. In some embodiments, the calibration circuit 180 calculates a standard deviation of the signals $S_2$, in order to determine the distribution of the signals $S_2$. In some embodiments, the calibration circuit 180 calculates a maximum number of signals having first logic values in the signals $S_2$, in order to determine the distribution of the signals $S_2$. Detailed descriptions regarding herein will be provided with reference to FIG. 3.

In some embodiments, the calibration circuit 180 may output a control signal $V_{C1}$ to calibrate the aforementioned common mode level, the at least one first reference voltage, and/or the at least one second reference voltage. For example, as shown in FIG. 1, the resistors RX and the resistors RY may be variable resistors, and the calibration circuit 180 may output the control signal $V_{C1}$ to adjust a resistance value of at least one of the resistors RX and/or that of the resistors RY, in order to calibrate the at least one first reference voltage and/or the at least one second reference voltage. In some embodiments, the flash analog to digital converter 100 further includes a voltage regulator circuit (not shown), which may generate an offset voltage (e.g., an offset voltage $V_{OS}$ in FIG. 2C) according to the control signal $V_{C1}$ to calibrate the common mode level. Alternatively, in some other embodiments, the voltage regulator circuit is a low-dropout regulator circuit that may adjust the voltage VRN and the voltage VRP according to the control signal $V_{C1}$, in order to calibrate the at least one first reference voltage and/or the at least one second reference voltage. In some embodiments, if the input signal $S_{IN}$+ and the input signal $S_{IN}$− are from output terminals of a precedent stage circuit (not shown in the figures) of the flash analog to digital converter 100. The calibration circuit 180 may transmit the control signal $V_{C1}$ to the precedent stage circuit, in order to adjust the common mode levels of the output terminals of the precedent stage circuit. In some embodiments, the calibration circuit 180 may determine the standard derivation of the signals $S_2$ according to the digital signal $S_D$.

In some embodiments, the calibration circuit 180 may be implemented with a digital signal processor circuit. In some embodiments, the calibration circuit 180 may be a foreground calibration circuit in the flash analog to digital converter 100. In some embodiments, the calibration circuit 180 may be an aided design system external to the flash analog to digital converter 100, and the aided design system may be configured to calibrate the comparator circuitry 160 in the course of fabricating the flash analog to digital converter 100.

The arrangements of the flash analog to digital converter 100 are given for illustrative purposes, and the present disclosure is not limited thereto. In some embodiments, the comparator circuitry 160 may include an interpolation network (not shown), which may perform an interpolation to generate the signals $S_2$. In some embodiments, the interpolation network may be an active network (e.g., one or more stages of amplifiers) or a passive network (e.g., a resistive network). Various flash analog to digital converters able to employ double differential comparator circuit(s) are within the contemplated scope of the present disclosure.

Figure 2A:
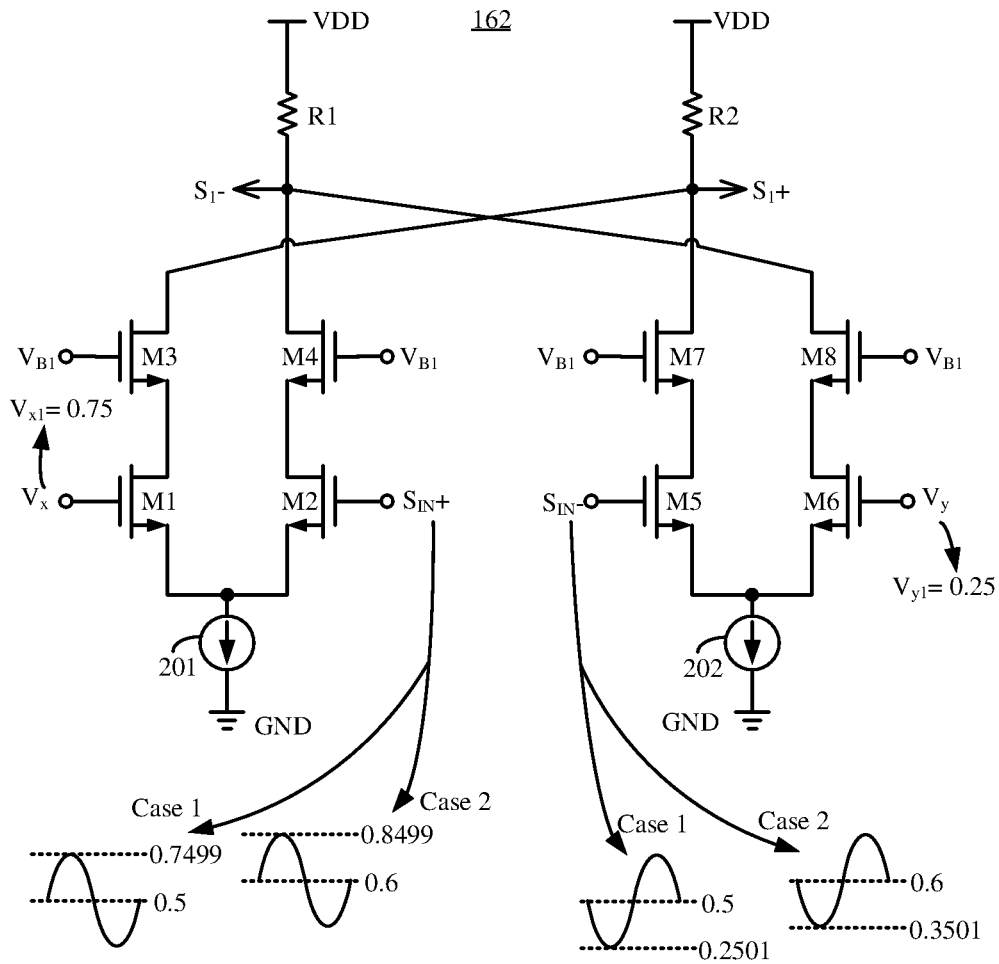
FIG. 2A is a schematic diagram of the double differential amplifier circuit in FIG. 1 according to some embodiments of the present disclosure.

FIG. 2A is a schematic diagram of the double differential amplifier circuit 162 in FIG. 1 according to some embodiments of the present disclosure. The double differential amplifier circuit 162 includes a current source circuit 201, a current source circuit 202, transistors M1-M8, and resistors R1-R2. The current source circuit 201 biases the transistors M1-M4. A first terminal of the current source circuit 201 is coupled to second terminals (e.g., source) of the transistors M1 and M2, and a second terminal of the current source circuit 201 receives a ground voltage GND. A first terminal (e.g., drain) of the transistor M1 is coupled to a second terminal of the transistor M3, and a control terminal (e.g., gate) of the transistor M1 receives a corresponding voltage (labeled as $V_x$) in the first set of reference voltages $V_{x1}$-$V_{xm}$. A first terminal of the transistor M3 is coupled to a second terminal of the resistor R2 to generate a signal $S_1$+, and a control terminal of the transistor M3 receives a bias signal $V_{B1}$. A first terminal of the resistor R2 receives a supply voltage VDD. A first terminal of the transistor M2 is coupled to a second terminal of the transistor M4, and a control terminal of the transistor M2 receives the input signal $S_{IN}$+. A first terminal of the transistor M4 is coupled to a second terminal of the resistor R1 to generate the signal $S_1$−, and a control terminal of the transistor M4 receives the bias signal $V_{B1}$. A first terminal of the resistor R1 receives the supply voltage VDD.

A first terminal of the current source circuit 202 is coupled to second terminals of the transistors M5 and M6, and a second terminal of the current source circuit 202 receives the ground voltage GND. A first terminal of the transistor M5 is coupled to a second terminal of the transistor M7, and a control terminal of the transistor M5 receives the input signal $S_{IN}$−. A first terminal of the transistor M7 is coupled to the second terminal of the resistor R2 to generate the signal $S_1$+, and a control terminal of the transistor M7 receives the bias signal $V_{B1}$. A first terminal of the transistor M6 is coupled to a second terminal of the transistor M8, and a control terminal of the transistor M6 receives a corresponding voltage (labeled as $V_y$) in the second set of reference voltages $V_{y1}$-$V_{ym}$. A first terminal of the transistor M8 is coupled to a second terminal of the resistor R1 to generate the signal $S_1$−, and a control terminal of the transistor M8 receives the bias signal $V_{B1}$.

The transistors M1-M2 operate as a first input pair circuit, and the transistors M5-M6 operate a second input pair circuit. Each of the transistors M1, M2, M5, and M6 has the same aspect ratio. As a result, each of transistors M1, M2, M5, and M6 may have the same transconductance value theoretically. With the circuit analysis, it can be derived that the signal $S_1$ may be expressed as the following equation:

$$S_1 = S_1+ - S_1- = gm \cdot R \cdot [(S_{IN}+ - V_x) - (S_{IN}- - V_y)],$$

in which gm is the aforementioned transconductance value, R is the resistance value of each of the resistors R1 and R2, and a difference between the signal $S_1$+ and the signal $S_1$− is the signal $S_1$ in FIG. 1.

Figure 2B:
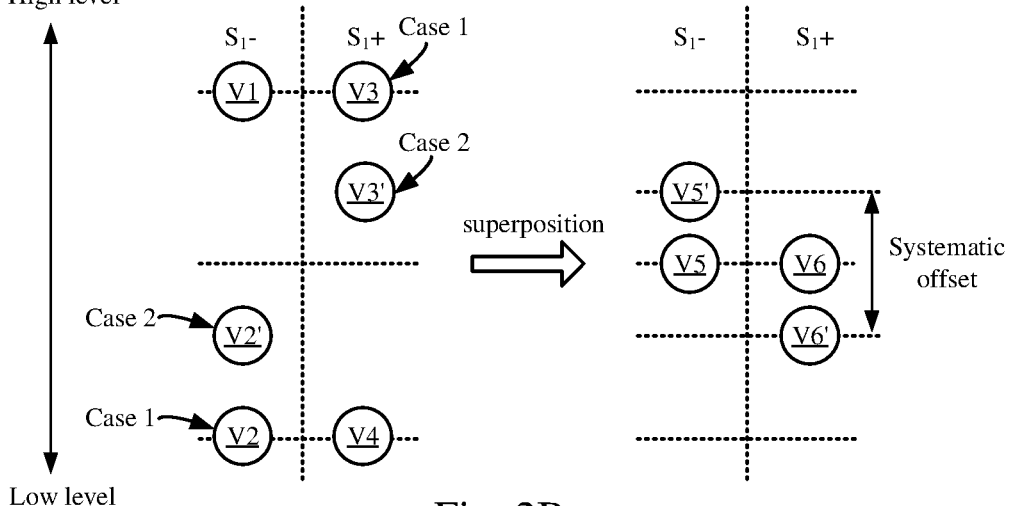
FIG. 2B is a schematic diagram showing a concept of the double differential amplifier circuit in FIG. 2A being affected by the systematic offset according to some embodiments of the present disclosure.

FIG. 2B is a schematic diagram showing a concept of the double differential amplifier circuit 162 in FIG. 2A being affected by the systematic offset according to some embodiments of the present disclosure. If the double differential amplifier circuit 162 in FIG. 2A is the double differential amplifier circuit 162-1 in FIG. 1, the reference voltage $V_x$ is the reference voltage $V_{x1}$ (e.g., 0.75 volts), and the reference voltage $V_y$ is the reference voltage $V_{y1}$ (e.g., 0.25 volts).

In case 1, each of the input signal $S_{IN}$+ and the input signal $S_{IN}$− in FIG. 2A has a predetermined common mode level of 0.5 volts and a signal swing of 0.2499 volts. From FIG. 2A, the signal $S_1$− is generated in response to the input signal $S_{IN}$+ and the reference voltage $V_{y1}$. According to the circuit analysis (e.g., a superposition theorem), it is understood that the signal $S_1$− is a sum V5 of a signal component V1 and a signal component V2, in which the signal component V1 is a voltage generated according to the reference voltage $V_{y1}$, and the signal component V2 is a voltage generated according to the input signal $S_{IN}$+. In case 1, the reference voltage $V_{y1}$ (i.e., 0.25 volts) is lower than the input signal $S_{IN}$+ (i.e., 0.7499 volts). Under this condition, a first voltage drop generated from the reference voltage $V_{y1}$ on the resistor R1 is smaller than a second voltage drop generated from the input signal $S_{IN}$+ on the resistor R2. Therefore, a level (i.e., the supply voltage VDD minus the first voltage drop) of the signal component V1 is higher than a level (i.e., the supply voltage VDD minus the second voltage drop).

Similarly, the signal $S_1$+ may be a sum V6 of a signal component V3 and a signal component V4, in which the signal component V3 is a voltage generated according to the input signal $S_{IN}$−, and the signal component V4 is a voltage generated according to the reference voltage $V_{x1}$. In case 1, the reference voltage $V_{x1}$ (i.e., 0.75 volts) is higher than the input signal $S_{IN}$− (i.e., 0.2501 volts). Under this condition, a third voltage drop generated from the reference voltage $V_{x1}$ on the resistor R2 is higher than a fourth voltage drop generated from the input signal $S_{IN}$− on the resistor R2. Therefore, a level of the signal component V3 (i.e., the supply voltage VDD minus the fourth voltage drop) is higher than a level of the signal component V4 (i.e., the supply voltage VDD minus the third voltage drop). As a result, in case 1, the common mode level (i.e., the sum V5) of the signal $S_1$− may be substantially equal to the common mode level (i.e., the sum V6) of the signal $S_1$+.

If the double differential amplifier circuit 162-1 has the systematic offset, it can be equivalently regarded as that the common mode level of each of the input signal $S_{IN}$+ and the input signal $S_{IN}$− are affected by an offset voltage. For example, in case 2, the common mode level of each of the input signal $S_{IN}$+ and the input signal $S_{IN}$− is deviated from 0.5 volts to 0.6 volts. Compared with case 1, the level of the input signal $S_{IN}$+ is increased to be 0.8499 volts. As this level is too high, the voltage on the first terminal of the transistor M2 is limited by the transistor M4. As a result, the transistor M2 may operate in a non-predetermined operation region (e.g., a linear region), which results in a lower transconductance value of the transistor M2. Under this condition, the current generated by the transistor M2 in response to the input signal $S_{IN}$+ will be lower. Accordingly, the second voltage drop will be lower as well. As a result, the signal component V2 is increased to be a signal component V2′. The reference voltage $V_{x1}$ is 0.75 volts for cases 1 and 2, and thus the level of the signal component V1 is kept unchanged. Accordingly, the common mode level (i.e., a sum V5′ of the signal component V1 and the signal component V2′) of the signal $S_1$− in case 2 is higher than the common mode level (i.e., a sum V5) of the signal $S_1$− in case 1.

Compared with case 1, the level of the input signal $S_{IN}$− is increased to 0.3501 volts. Under this condition, the current generated by the transistor M5 in response to the input signal $S_{IN}$− is higher. Therefore, the fourth voltage drop is higher as well. As a result, the signal component V3 is decreased to be a signal component V3′. The reference voltage $V_{y1}$ is 0.25 volts for cases 1 and 2, and thus the level of the signal component V4 is kept unchanged. Accordingly, the common mode level (i.e. a sum V6′ of the signal component V3′ and a signal component V4) of the signal $S_1$+ in case 2 is lower than that (i.e., the sum V6) in case 1. In other words, in case 2, the common mode level (i.e., the sum V6′) of the signal $S_1+$ is different from the common mode level (i.e., the sum V5') of the signal $S_1-$, in which a difference between the signal $S_1+$ and the signal $S_1-$ is the systematic offset, which may results in operation failure of a corresponding comparator circuit.

Figure 2C:
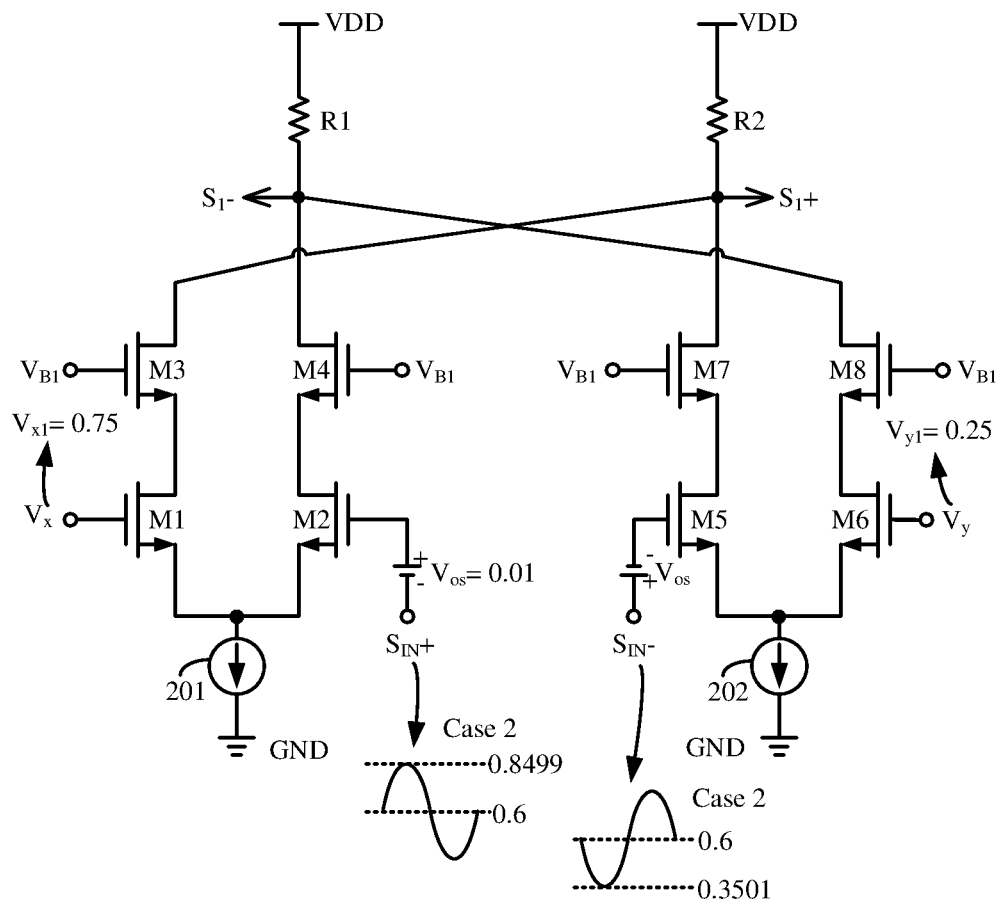
FIG. 2C is a schematic diagram of the double differential amplifier circuit in FIG. 2A being calibrated according to some embodiments of the present disclosure.

FIG. 2C is a schematic diagram of the double differential amplifier circuit 162 in FIG. 2A being calibrated according to some embodiments of the present disclosure. In order to calibrate the offset, in this example, an offset voltage $V_{OS}$ of +0.01 volts is applied to the control terminal of the transistor M2, and an offset voltage $V_{OS}$ of −0.01 volts is applied to the control terminal of the transistor M5. In an experimental example, by applying the offset voltage $V_{OS}$, the offset in previous case 2 can be eliminated effectively, in order to avoid operation failure of the comparator circuit.

Figure 2D:
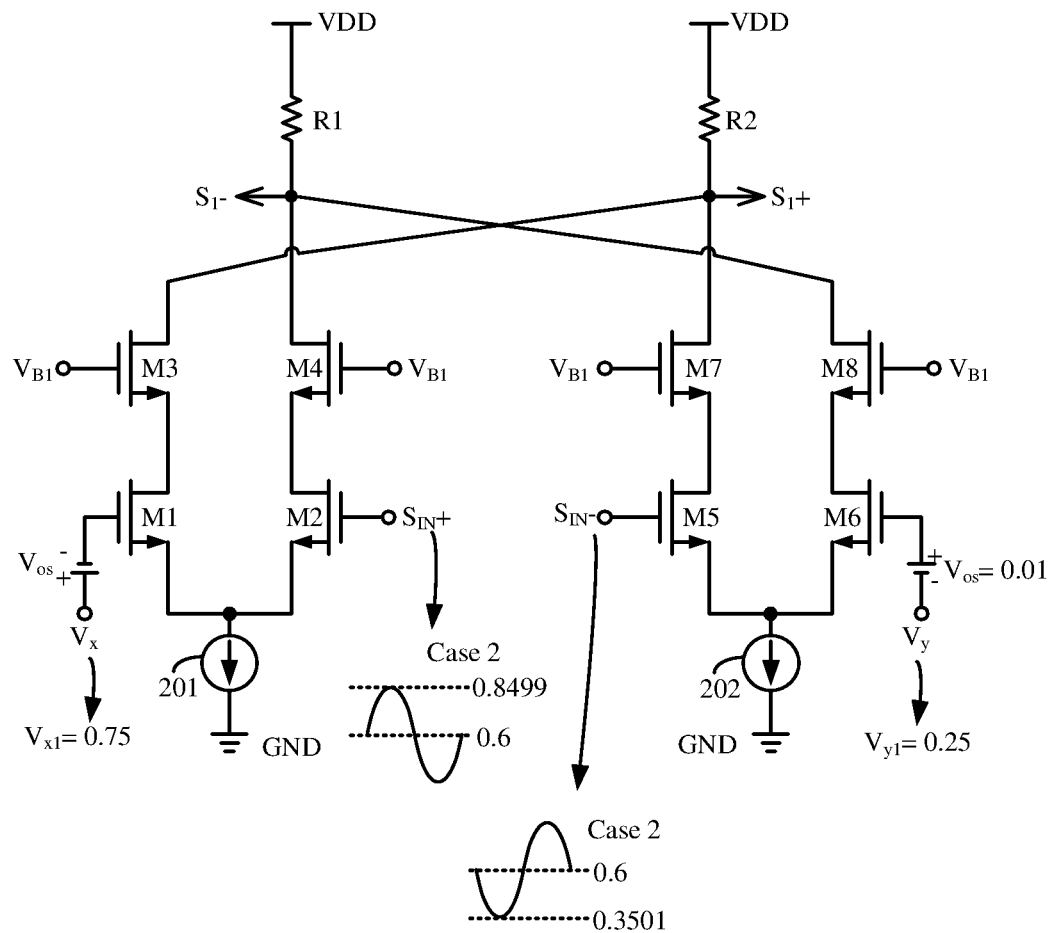
FIG. 2D is a schematic diagram of the double differential amplifier circuit in FIG. 2A being calibrated according to some embodiments of the present disclosure.

FIG. 2D is a schematic diagram of the double differential amplifier circuit 162 in FIG. 2A being calibrated according to some embodiments of the present disclosure. In examples of FIG. 2C, the calibration circuit 180 adjusts the level of the signal component V2' and that of the signal component V3' to calibrate the systematic offset. As shown in FIG. 2B, the common mode level (i.e., the sum V5') of the signal component $S_1-$ is associated with the signal component V1 and the signal component V2', and the common mode level (i.e., the sum V6') of the signal component $S_1+$ is associated with the signal component V3' and the signal component V4. Therefore, the calibration circuit 180 may adjust the signal component V1 and the signal component V4 to calibrate the offset as well. In this example, the offset voltage $V_{OS}$ having −0.01 volts is applied to the control terminal of the transistor M1, and the offset voltage $V_{OS}$ having +0.01 volts is applied to the control terminal of the transistor M6. Under this condition, the level of the signal component V1 is lower, and the level of the signal component V4 is higher. As a result, the offset can be eliminated effectively, in order to avoid operation failure of the comparator circuit. It is understood that, according to FIG. 2C and FIG. 2D, in order to reduce the offset, the offset voltages $V_{OS}$ having different polarities are applied to different transistors in the same input pair circuit.

The above descriptions are given with reference to examples where the double differential amplifier circuit 162-1 receives the reference voltage $V_{x1}$ and the reference voltage $V_{y1}$. The reference voltage $V_{x1}$ and the reference voltage $V_{y1}$ form two extreme bias conditions for the input pair circuits respectively. Compared with other double differential amplifier circuits 162 (e.g., 162-n in FIG. 1), the input pair circuits in the double differential amplifier circuit 162-1 are easier to be affected by the systematic offset. Similarly, in some embodiments, the double differential amplifier circuit 162-2 in FIG. 1 that receives the reference voltage $V_{xm}$ and the reference voltage $V_{ym}$ is also easier to be affected by the systematic offset. Accordingly, in some embodiments, the at least one first reference voltage calibrated by the calibration circuit 180 may include, but not limited to, at least one of the reference voltage $V_{x1}$ or the reference voltage $V_{xm}$, and the at least one second reference voltage calibrated by the calibration circuit 180 may include, but not limited to, at least one of the reference voltage $V_{y1}$ or the reference voltage $V_{ym}$.

The arrangements of the double differential amplifier circuit 162 are given for illustrative purposes, and the present disclosure is not limited thereto. It is understood that, the above descriptions are for circuit architecture in FIG. 2A. With different circuit architectures and/or circuit settings (e.g., sizes of transistors, practical bias condition(s), or the like), the cause of the systematic offset may be different.

Figure 3:
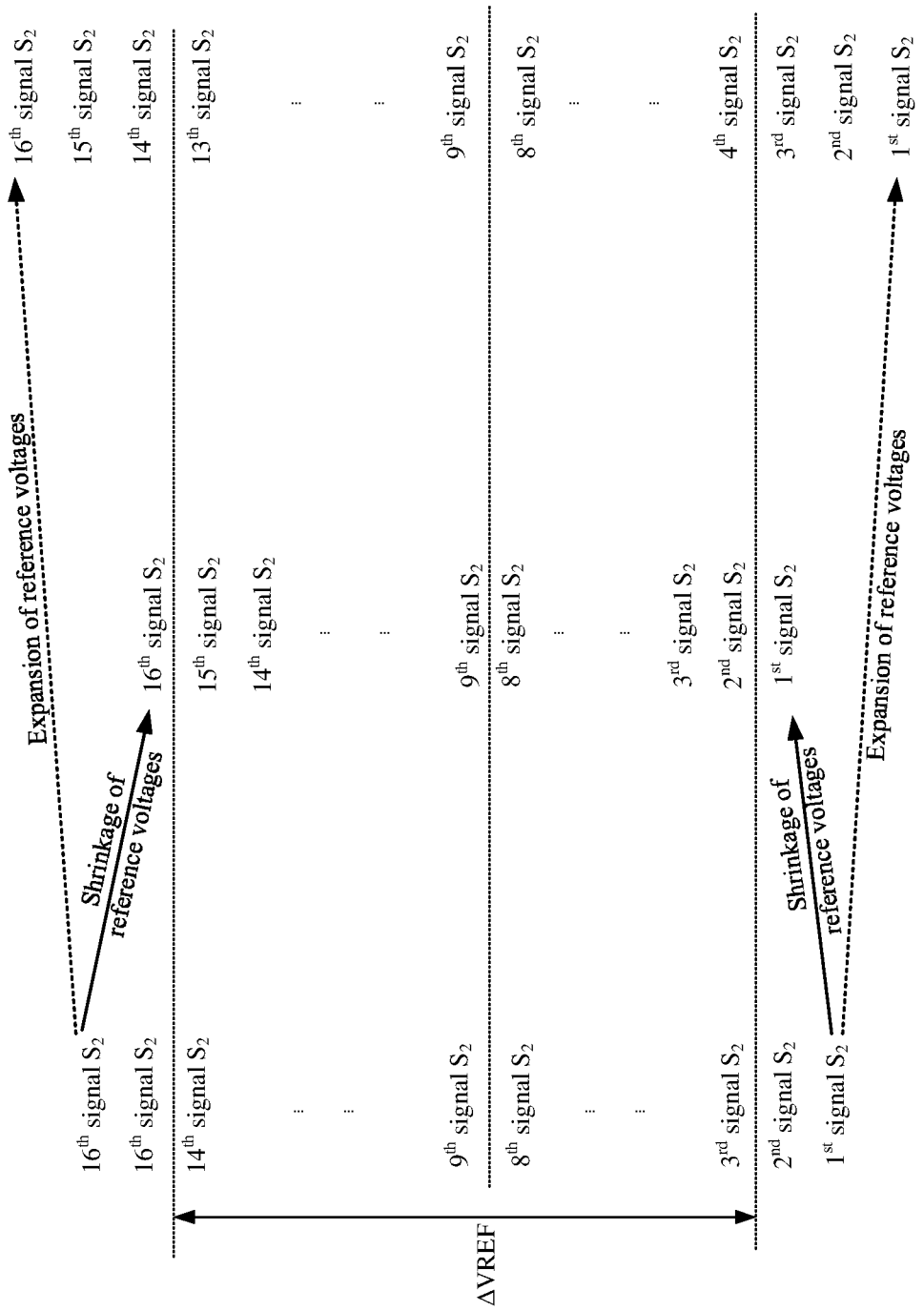
FIG. 3 is a schematic diagram showing a concept of operations of the calibration circuit in FIG. 1 according to some embodiments of the present disclosure.

FIG. 3 is a schematic diagram showing a concept of operations of the calibration circuit 180 in FIG. 1 according to some embodiments of the present disclosure. In this example, the calibration circuit 180 may analyze the signals $S_2$, in order to detect the systematic offset. If the comparator circuitry 160 includes 16 comparator circuits, the comparator circuitry 160 generates 16 signals $S_2$. For example, a sixteenth signal $S_2$ is from the double differential amplifier circuit 162-1 and a corresponding latch circuit 164, and a first signal $S_2$ is from the double differential amplifier circuit 162-2 and a corresponding latch circuit 164.

If the systematic offset does not exist, the transconductance value of the transistor M2 and/or that of the transistor M5 is a predetermined value. Under this condition, a range of a difference (hereinafter referred to as $\Delta V$) between the input signal $S_{IN}+$ the input signal $S_{IN}-$ after being processed by the transistors M2 and M5 is expected to correspond to a predetermined reference voltage range $\Delta VREF$. The predetermined reference voltage range $\Delta VREF$ may be determined by two voltages in the first set of reference voltages $V_{x1}$-$V_{xm}$ (or the second set of reference voltages $V_{y1}$-$V_{ym}$). In this example, under a predetermined signal swing, 12 comparator circuits may generate the signals $S_2$ (for example, the third to the fourteenth signals $S_2$) having first logic values (e.g., logic values of 1) in response to the input signal $S_{IN}$. In other words, in an ideal case, there are twelve signals $S_2$ corresponding to the predetermined reference voltage range $\Delta VREF$.

However, if the systematic offset causes the transconductance value of the transistor M2 and/or that of the transistor M5 to be lower, the difference $\Delta V$ after being processed by the transistors M2 and M5 will be smaller than the predetermined reference voltage range $\Delta VREF$. Under the same signal swing, certain comparator circuits may determine that the input signal $S_{IN}$ is smaller than a difference between the reference voltage $V_x$ and the reference voltage $V_y$ and are kept outputting the signals $S_2$ (for example, the first to the third and the fourteenth to the sixteenth signals $S_2$) having second logic values (e.g., a logic value of 0). In this case, there are only 10 signals $S_2$ (e.g., the fourth to the thirteenth signals $S_2$) corresponding to the predetermined reference voltage range $\Delta VREF$.

Explained in a different way, as these comparator circuits output the signals $S_2$ having the second logic values on condition that the input signal $S_{IN}$ is determined to be less than the difference between the reference voltage $V_x$ and the reference voltage $V_y$, the level of the reference voltage $V_x$ and/or that of the reference voltage $V_y$ received by these comparator circuits may be considered as being increased equivalently (compared with the ideal case) due to impacts from the systematic offset. The above phenomenon may be referred to as "expansion of reference voltages." In this phenomenon, it can be observed that a maximum number of the signals $S_2$, which have the first logic values and correspond to the predetermined reference voltage range $\Delta VREF$, is reduced (which equals to a decrease in the distribution of the signals $S_2$). On the other hand, the calibration circuit 180 may count and calculate a standard deviation of sequence numbers (which may be 4 to 13 in examples of FIG. 3) corresponding to the signals $S_2$ having the first logic values. If the standard deviation is lower, it indicates that the distribution of the signals $S_2$ is decreased, and thus the "expansion of reference voltages" is detected. The calibration circuit 180 may output the control signal $V_{C1}$ to adjust the common mode level of the input signal $S_{IN}+$ and that of the input signal $S_{IN}-$ (as shown in FIG. 2C), in order to calibrate the offset. Alternatively, the calibration circuit 180 may output the control signal $V_{C1}$ to adjust the reference voltage $V_x$ and the reference voltage $V_y$ received by the comparator circuits that generate the third to the fourteen signals $S_2$ (as shown in FIG. 2D), in order to calibrate the offset.

In another case, if the systematic offset cause the transconductance value of the transistor M2 and/or that of the transistor M5 to be higher, the difference $\Delta V$ after being processed by the transistors M2 and M5 will be larger than the predetermined reference voltage range $\Delta VREF$. Under the same signal swing, a number of the comparator circuits, which determine that the input signal $S_{IN}$ is greater than the difference between the voltage $V_x$ and the reference voltage $V_y$ to output the signals $S_2$ (e.g., the second to the fifteen signals $S_2$) having specific logic values (e.g., logic values of 1), is increased. In this case, there are 14 signals $S_2$ corresponding to the predetermined reference voltage range $\Delta VREF$.

Explained in a different way, as these comparator circuit output the signals $S_2$ having the specific logic values on condition that the input signal $S_{IN}$ is determined to be greater than the difference between the reference voltage $V_x$ and the reference voltage $V_y$, the level of the reference voltage $V_x$ and/or that of the reference voltage $V_y$ received by these comparator circuits may be considered as being decreased equivalently (compared with the ideal case) due to impacts from the systematic offset. The above phenomenon may be referred to as "shrinkage of reference voltages." In this phenomenon, it can be observed that the maximum number of the signals $S_2$, which have the first logic values and correspond to the predetermined reference voltage range $\Delta VREF$, is increased (which equals to an increase in the distribution of the signals $S_2$). On the other hand, the calibration circuit 180 may count and determine the standard deviation of sequence numbers (which may be 2 to 15 in examples of FIG. 3) corresponding to the signals $S_2$ having the first logic values. If the standard deviation is higher, it indicates that the distribution of the signals $S_2$ is increased, and thus the "shrinkage of reference voltages" is detected. Similarly, the calibration circuit 180 may adjust the common mode level of the input signal $S_{IN}+$ and that of the input signal $S_{IN}-$ (as shown in FIG. 2C), or adjust the reference voltage $V_x$ and the reference voltage $V_y$ received by the comparator circuits that generate the second to the fifteen signals $S_2$ (as shown in FIG. 2D), in order to calibrate the offset.

It is understood that, the above detection of the systematic offset is achieved by observing the signals $S_2$ outputted from the comparator circuitry 160. Therefore, such detection is not limited by internal circuit architecture of the double differential amplifier circuit 162, and thus various systematic offsets from various causes may be detected.

The following table shows a simulation result in an experimental example:

| Systematic offset (mV) | 0 | +100 |
|---|---|---|
| Standard deviation (sequence number) | 4.4 | 4 |

The systematic offset in the table is equal to an offset on the common mode level of each of the input signal $S_{IN}+$ and the input signal $S_{IN}-$. In some embodiments, the calibration circuit 180 may output the test signal $S_{T1}$ and the test signal $S_{T2}$, which each has a predetermined common mode level (i.e., the systematic offset is 0 mV), to be the input signal $S_{IN}+$ and the input signal $S_{IN}-$ respectively. In response to the test signal $S_{T1}$ and the test signal $S_{T2}$, the comparator circuitry 160 generates the signals $S_2$. The calibration circuit 180 may determine the standard deviation of these signals $S_2$, and store this standard deviation (which corresponds to the predetermined common mode level) to be a predetermined value of the distribution of the signals $S_2$.

Afterwards, the calibration circuit 180 may add the systematic offset to the common mode level of each of the test signal $S_{T1}$ and the test signal $S_{T2}$, and output the test signal $S_{T1}$ and the test signal $S_{T2}$ to be the input signal $S_{IN}+$ and the input signal $S_{IN}-$ respectively. Based on the similar operations, the calibration circuit 180 may determine the current standard deviation of these signals $S_2$. The calibration circuit 180 may compare the current standard deviation with the previously stored predetermined value, and adjust the common mode level, or adjust the at least one first reference voltage and the at least one second reference voltage when the current standard deviation is different from the predetermined value.

For example, as shown in the above table, when the systematic offset is 0 mV (i.e., the systematic offset is not added), the predetermined value of the signals $S_2$ is 4.4. When the offset voltage of +100 mV is added, the standard deviation of the signals $S_2$ is 4. As the current distribution (i.e., 4) is smaller than the predetermined value (i.e., 4.4), the calibration circuit 180 may determine that certain double differential amplifier circuits 162 in the comparator circuitry 160 are affected by the "expansion of reference voltages."

Alternatively, if the offset voltage is added, the standard deviation (i.e., 4.4) of the signals $S_2$ is greater than predetermined value, the calibration circuit 180 may determine that certain double differential amplifier circuits 162 in the comparator circuitry 160 are affected by the "shrinkage of reference voltages."

In some embodiments, the test signal $S_{T1}$ and the test signal $S_{T2}$ may be signals that each has a predetermined common mode level and a predetermined signal swing. In some embodiments, the test signal $S_{T1}$ and the test signal $S_{T2}$ may be DC signals. The calibration circuit 180 may sequentially output the test signal $S_{T1}$ and the test signal $S_{T2}$ having different DC levels, in order to analyze the distribution of the signals $S_2$.

The above examples where the distribution of the signals $S_2$ is determined according to the maximum number of the signals $S_2$ having the first logic values or the standard deviation are given for illustrative purposes, and the present disclosure is not limited thereto. Various statistical indexes able to indicate the distribution of the signals $S_2$ are within the contemplated scope of the present disclosure.

FIG. 4 is a flow chart of a calibration method 400 according to some embodiments of the present disclosure. In some embodiments, the calibration method 440 may be, but not limited to, performed by the calibration circuit 180 in FIG. 1.

In operation S410, the first test signal is outputted to be the first input signal, and the second test signal is outputted to be the second input signal, in which the flash analog to digital converter includes double differential comparator circuits, each of the double differential comparator circuits compares the first input signal with a corresponding voltage in the first set of reference voltages, and compares the second input signal with a corresponding voltage in the second set of reference voltages, in order to generate a corresponding one of the first signals.

In operation S420, according to the distribution of the first signals, a common mode level of each of the first input signal and the second input signal, or at least one first reference voltage in the first set of reference voltages and at least one second reference voltage in the second set of reference voltages are calibrated.

The above operations of the calibration method 400 can be understood with reference to various embodiments discussed above, and thus the repetitious descriptions are not given. The above description of the calibration method 400 includes exemplary operations, but the operations are not necessarily performed in the order described above. Operations of the calibration method 400 may be added, replaced, changed order, and/or eliminated as appropriate, or the operations are able to be executed simultaneously or partially simultaneously as appropriate, in accordance with the spirit and scope of various embodiments of the present disclosure.

As described above, the flash analog to digital converter and the calibration method in some embodiments of the present disclosure may analyze the distribution of signals to observe whether the comparator circuitry is affected by the systematic offset, and calibrate the systematic offset to improve the reliability of overall operations.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A flash analog to digital converter, comprising:
   a plurality of double differential comparator circuits, wherein each of the plurality of double differential comparator circuits is configured to compare a first input signal with a corresponding voltage in a first set of reference voltages, and compare a second input signal with a corresponding voltage in a second set of reference voltages, in order to generate a corresponding signal in a plurality of first signals; and
   a calibration circuit configured to output a first test signal to be the first input signal and output a second test signal to be the second input signal in a test mode, determine a statistical index that indicates a distribution of the plurality of first signals according to the plurality of first signals, and calibrate a common mode level of each of the first input signal and the second input signal according to the statistical index, or calibrate at least one first reference voltage in the first set of reference voltages and at least one second reference voltage in the second set of reference voltages according to the statistical index.

2. The flash analog to digital converter of claim 1, wherein the calibration circuit is configured to compare the distribution with a predetermined value, in order to adjust the common mode level, or adjust the at least one first reference voltage and the at least one second reference voltage.

3. The flash analog to digital converter of claim 2, wherein the calibration circuit is configured to output the first test signal and the second test signal that each has a predetermined common mode level, and store the distribution corresponding to the predetermined common mode level to be the predetermined value.

4. The flash analog to digital converter of claim 1, wherein the calibration circuit is configured to determine a standard deviation of the plurality of first signals, in order to determine the distribution, and the standard deviation is the statistical index.

5. The flash analog to digital converter of claim 1, further comprising:
   a reference voltage generator circuit configured to generate the first set of reference voltages and the second of reference voltages according to a first voltage and a second voltage.

6. The flash analog to digital converter of claim 5, wherein the at least one first reference voltage comprises at least one of a third voltage or a fourth voltage, the third voltage is a voltage closet to the first voltage in the first set of reference voltages, and the fourth voltage is a voltage closet to the second voltage in the first set of reference voltages.

7. The flash analog to digital converter of claim 5, wherein the at least one second reference voltage comprises at least one of a third voltage or a fourth voltage, the third voltage is a voltage closet to the first voltage in the second set of reference voltages, and the fourth voltage is a voltage closet to the second voltage in the second set of reference voltages.

8. The flash analog to digital converter of claim 1, wherein the distribution of the plurality of first signals indicates a maximum number of signals having predetermined logic values in the plurality of first signals.

9. The flash analog to digital converter of claim 8, wherein if the maximum number of signals having the predetermined logic values in the plurality of first signals is increased, the distribution of the plurality of first signals is increased.

10. The flash analog to digital converter of claim 1, wherein values of voltages in the first set of reference voltages are different from each other.

11. The flash analog to digital converter of claim 1, wherein values of voltages in the second set of reference voltages are different from each other.

12. A calibration method for calibrating a flash analog to digital converter, comprising:
    outputting a first test signal to be a first input signal and outputting a second test signal to be a second input signal,
    wherein the flash analog to digital converter comprises a plurality of double differential comparator circuits, each of the plurality of double differential comparator circuits is configured to compare a first input signal with a corresponding voltage in a first set of reference voltages, and compare a second input signal with a corresponding voltage in a second set of reference voltages, in order to generate a corresponding signal in a plurality of first signals; and determining a statistical index that indicates a distribution of the plurality of first signals according to the plurality of first signals, and calibrating a common mode level of each of the first input signal and the second input signal according to the statistical index, or calibrating at least one first reference voltage in the first set of reference voltages and at least one second reference voltage in the second set of reference voltages according to the statistical index.

13. The calibration method of claim 12, wherein determining the statistical index that indicates the distribution of the plurality of first signals according to the plurality of first signals comprises:

determining a standard deviation of the plurality of first signals, in order to determine the distribution, wherein the standard deviation is the statistical index.

14. The calibration method of claim 12, wherein calibrating the common mode level or the at least one first reference voltage and the at least one second reference voltage according to the statistical index comprises:

comparing the distribution with a predetermined value; and when the distribution is different from the predetermined value, adjusting the common mode level or adjusting the at least one first reference voltage and the at least one second reference voltage.

15. The calibration method of claim 14, further comprising:

outputting the first test signal and the second test signal that each has a predetermined common mode level; and storing the distribution corresponding to the predetermined common mode level to be the predetermined value.

16. The calibration method of claim 12, wherein the flash analog to digital converter comprises a reference voltage generator that generates the first set of reference voltages according to a first voltage and a second voltage, the at least one first reference voltage comprises at least one of a third voltage or a fourth voltage, the third voltage is a voltage closet to the first voltage in the first set of reference voltages, and the fourth voltage is a voltage closet to the second voltage in the first set of reference voltages.

17. The calibration method of claim 12, wherein the flash analog to digital converter comprises a reference voltage generator that generates the second set of reference voltages according to a first voltage and a second voltage, the at least one second reference voltage comprises at least one of a third voltage or a fourth voltage, the third voltage is a voltage closet to the first voltage in the second set of reference voltages, and the fourth voltage is a voltage closet to the second voltage in the second set of reference voltages.

* * * * *